(12) United States Patent
Jung et al.

(10) Patent No.: US 9,385,166 B2
(45) Date of Patent: Jul. 5, 2016

(54) IMAGE SENSOR AND IMAGE PROCESSING DEVICE

(71) Applicant: SAMSUNG ELECTRONICS CO., LTD., Suwon-Si, Gyeonggi-Do (KR)

(72) Inventors: Jung-Kyu Jung, Seoul (KR); Sang-Chul Sul, Suwon-si (KR); Gwi-Deok Lee, Suwon-si (KR); Tae-Yon Lee, Seoul (KR); Myung-Won Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/596,464

(22) Filed: Jan. 14, 2015

(65) Prior Publication Data

US 2015/0221702 A1    Aug. 6, 2015

(30) Foreign Application Priority Data

Feb. 4, 2014 (KR) .................. 10-2014-0012677

(51) Int. Cl.
| | | |
|---|---|---|
| *H01L 27/148* | (2006.01) | |
| *H01L 27/30* | (2006.01) | |
| *H01L 27/146* | (2006.01) | |
| *H01L 27/28* | (2006.01) | |

(52) U.S. Cl.
CPC .......... *H01L 27/307* (2013.01); *H01L 27/1463* (2013.01); *H01L 27/1464* (2013.01); *H01L 27/14603* (2013.01); *H01L 27/14609* (2013.01); *H01L 27/14643* (2013.01); *H01L 27/14665* (2013.01); *H01L 27/286* (2013.01)

(58) Field of Classification Search
CPC ............ H01L 27/286; H01L 27/14603; H01L 27/14609; H01L 27/1463; H01L 27/1464; H01L 27/14643; H01L 27/14665
See application file for complete search history.

(56) References Cited

U.S. PATENT DOCUMENTS

| | | |
|---|---|---|
| 6,388,256 B1 | 5/2002 | Watton et al. |
| 6,974,946 B2 | 12/2005 | Yonezawa et al. |
| 7,429,529 B2 | 9/2008 | Farnworth et al. |
| 7,623,365 B2 | 11/2009 | Jeddeloh |
| 7,880,307 B2 | 2/2011 | Farnworth et al. |
| 8,174,859 B2 | 5/2012 | Jeddeloh |
| 8,193,542 B2 | 6/2012 | Maehara |
| 8,314,498 B2 | 11/2012 | Hutto et al. |
| 8,338,294 B2 | 12/2012 | Sadaka |
| 8,339,827 B2 | 12/2012 | Jeddeloh |
| 8,378,399 B2 | 2/2013 | Maeda |

(Continued)

FOREIGN PATENT DOCUMENTS

| | | |
|---|---|---|
| JP | 2012023207 | 2/2012 |
| JP | 2013065688 | 4/2013 |

(Continued)

*Primary Examiner* — Su C Kim
(74) *Attorney, Agent, or Firm* — Volentine & Whitt, PLLC

(57) ABSTRACT

An image sensor includes a semiconductor layer, an organic photoelectric conversion portion disposed on an upper surface of the semiconductor layer and that converts a color component of incident light into a corresponding electrical signal, a transistor layer disposed on a lower surface of the semiconductor layer and including a pixel circuit that receives the electrical signal, and penetration wiring that laterally penetrates a side surface of the semiconductor layer between the upper and lower surfaces and that electrically connects the organic photoelectric conversion portion with the pixel circuit to communicate the electrical signal.

17 Claims, 12 Drawing Sheets

(56) References Cited

U.S. PATENT DOCUMENTS

| | | |
|---|---|---|
| 8,405,191 B2 | 3/2013 | Tuttle |
| 8,513,758 B2 | 8/2013 | Tian et al. |
| 8,513,762 B2 | 8/2013 | Qian et al. |
| 8,593,849 B2 | 11/2013 | Jeddeloh |
| 8,691,617 B2 | 4/2014 | Kim et al. |
| 2011/0001128 A1* | 1/2011 | Kim ............ B82Y 10/00 257/40 |
| 2011/0019042 A1* | 1/2011 | Yamaguchi ..... H01L 27/14632 348/280 |
| 2012/0007120 A1* | 1/2012 | Kim ................ H01L 33/58 257/98 |
| 2012/0178258 A1 | 7/2012 | Kwon et al. |
| 2013/0070131 A1 | 3/2013 | Ohkubo et al. |
| 2013/0075607 A1 | 3/2013 | Bikumandla et al. |
| 2014/0063942 A1 | 3/2014 | Jeddeloh |

FOREIGN PATENT DOCUMENTS

| | | |
|---|---|---|
| KR | 100954003 | 4/2010 |
| KR | 1020100058605 A | 6/2010 |
| KR | 1020130011419 A | 1/2013 |
| KR | 1020130083543 A | 7/2013 |

\* cited by examiner

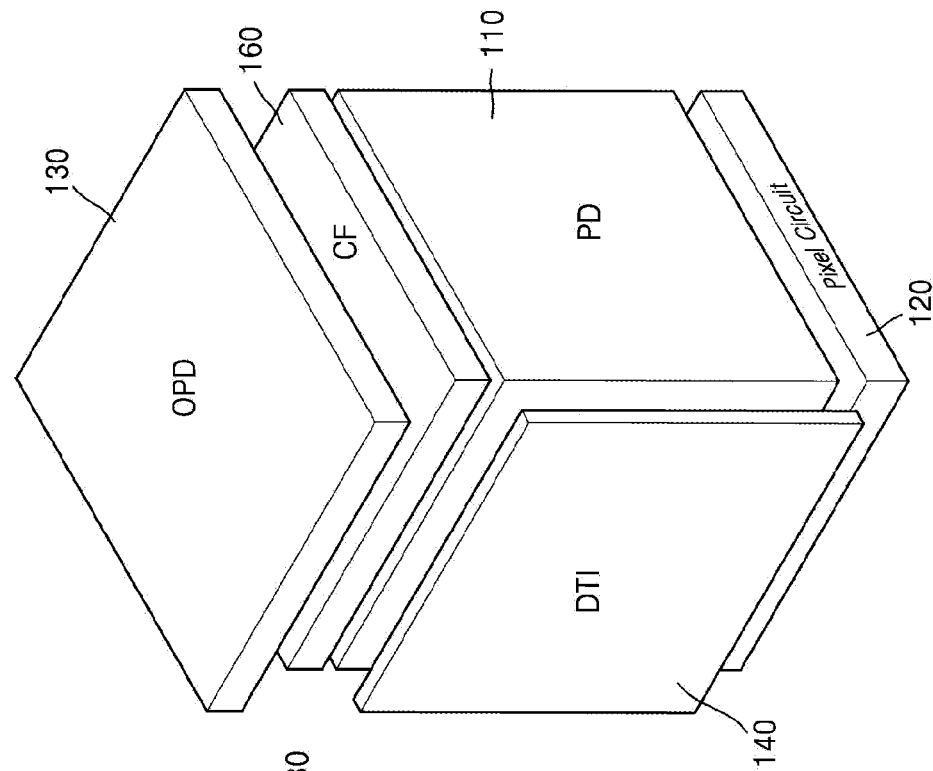
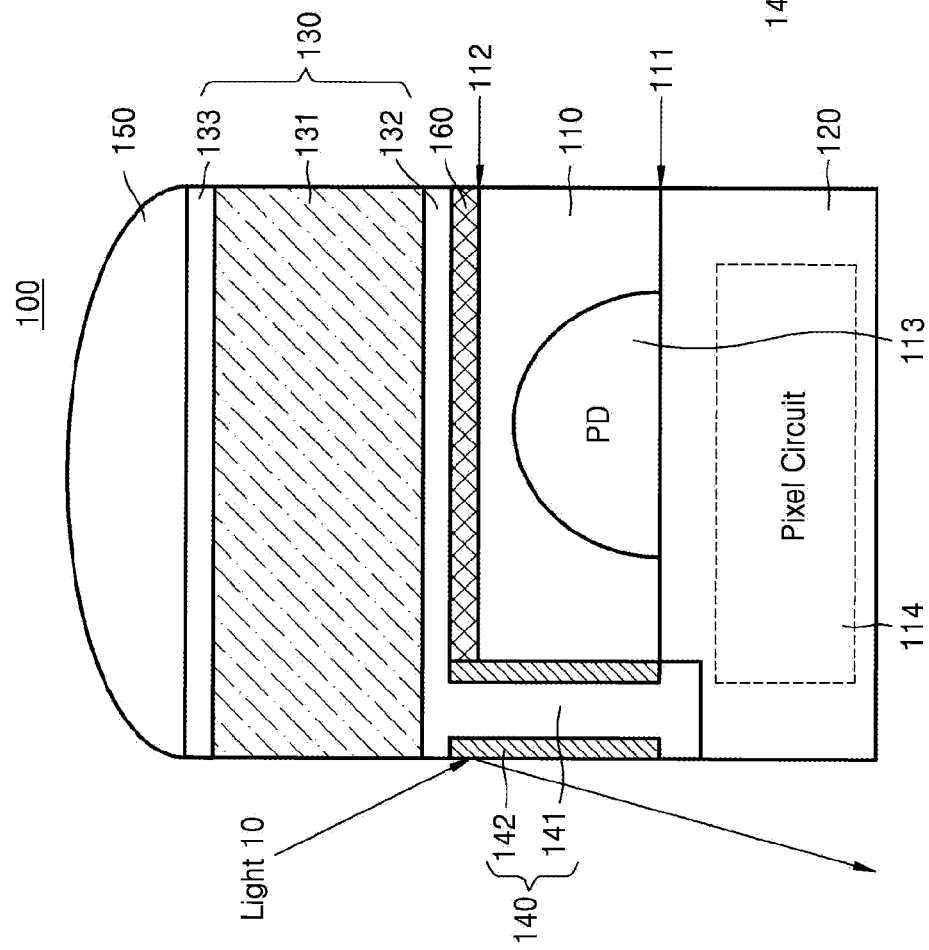

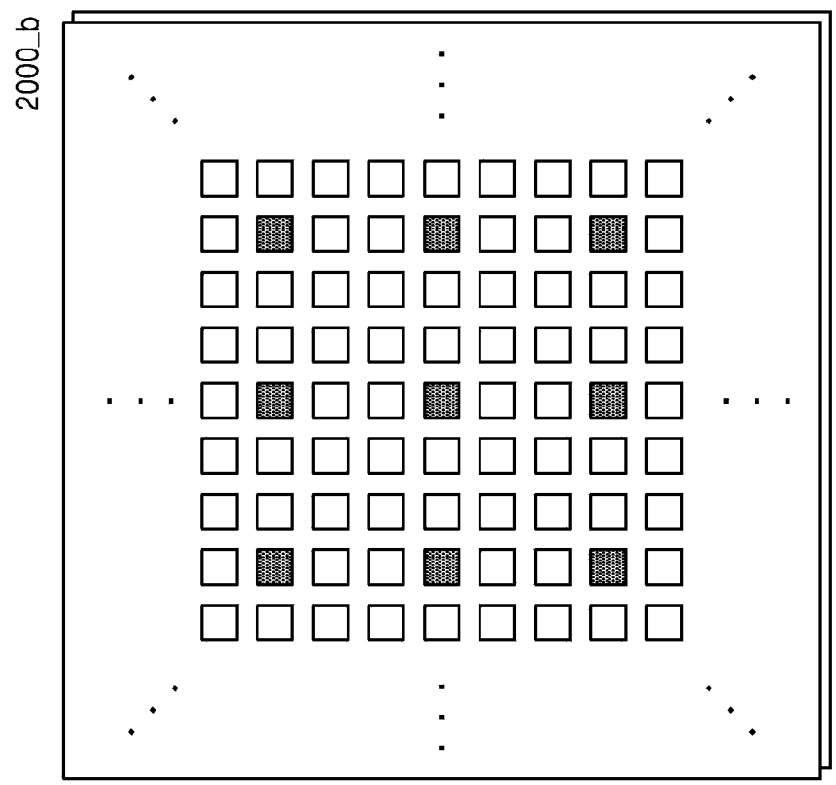
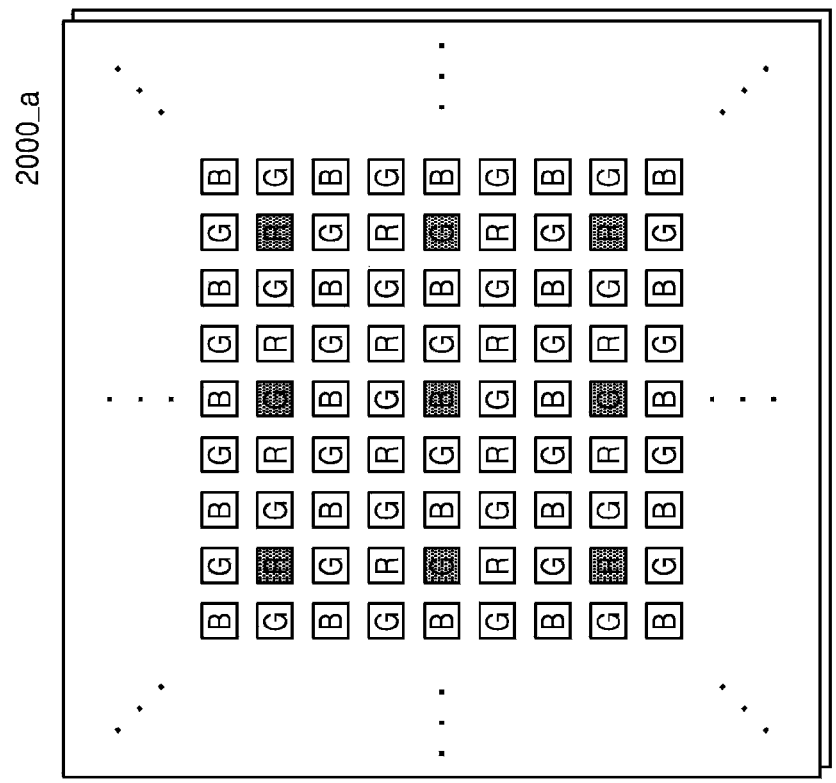
FIG. 9C

IMAGE SENSOR AND IMAGE PROCESSING DEVICE

CROSS-REFERENCE TO RELATED APPLICATIONS

This application claims the benefit of Korean Patent Application No. 10-2014-0012677 filed on Feb. 4, 2014, the subject matter of which is hereby incorporated by reference.

BACKGROUND

The inventive concept generally relates to image sensors and image processing devices associated with image sensors.

Image sensors are devices able to convert a captured visible image into corresponding electrical signals. Image sensors come in many shapes, sizes, and varieties. Some are used in cameras (e.g., digital cameras like the ones used in mobile phones and portable camcorders), some are mounted on cars, buildings or robots, and some are used in safety devices. Image sensors usually include a pixel array wherein each unit pixel includes a photodetector—like a photodiode capable of generating a current in proportion to absorbed light.

Image sensors are mass manufactured using a complex sequence of semiconductor manufacturing processes. Thus, image sensors include multiple transistors like those used to control operation of a photodiode, drive the pixel array, etc. Each of these elements is formed by various applications of semiconductor manufacturing processes. Backside illuminated image sensors form transistors and wiring layers on one side of a semiconductor layer on which a photodetector is disposed.

SUMMARY

The inventive concept provides various layouts and/or device architectures that enhance resolution of an image sensor. Unit pixel size may be reduced.

According to an aspect of the inventive concept, there is provided an image sensor including a plurality of unit pixels, wherein each of the plurality of unit pixels includes: a semiconductor layer including a first side and a second side that faces the first side in a second direction; an organic photoelectric conversion portion that is formed on the second side of the semiconductor layer in the first direction and that converts light in a first wavelength band into electrical signals; a substrate that is disposed on the first side of the semiconductor layer in a second direction and that includes a pixel circuit; and a penetration wiring that penetrates the semiconductor layer and that electrically connects the organic photoelectric conversion portion and the pixel circuit.

The image sensor may further include a color filter layer through which light in a second wavelength band of light that is not converted by the organic photoelectric conversion portion into electrical signals passes, wherein the semiconductor layer further include a photodetector that is formed in the semiconductor layer and contacts the first side of the semiconductor layer and that accumulates charges according to the intensity of light that passes through the color filter layer.

The organic photoelectric conversion portion may include a first organic photoelectric conversion portion that is formed on the second side of the semiconductor layer in the first direction and that includes a first lower electrode, a first color selection layer having a characteristic of photoelectric conversion with respect to light in the first wavelength band, and a first upper electrode.

The organic photoelectric conversion portion may further include a second organic photoelectric conversion portion that is formed on the first organic photoelectric conversion portion in the first direction and that includes a second lower electrode, a second color selection layer having a characteristic of photoelectric conversion with respect to light in a second wavelength band, and a second upper electrode.

The organic photoelectric conversion portion may include: a first organic photoelectric conversion portion that is formed on the second side of the semiconductor layer and that includes a first lower electrode, a first color selection layer having a characteristic of photoelectric conversion with respect to light in the first wavelength band, and a first upper electrode; a second organic photoelectric conversion portion that is formed on the first organic photoelectric conversion portion in the first direction and that includes a second lower electrode, a second color selection layer having a characteristic of photoelectric conversion with respect to light in a second wavelength band, and a second upper electrode; and a third organic photoelectric conversion portion that is formed on the second organic photoelectric conversion portion in the first direction and that includes a third lower electrode, a third color selection layer having a characteristic of photoelectric conversion with respect to light in a third wavelength band, and a third upper electrode.

The pixel circuit may include a signal charge reading unit that reads electrical signals from the organic photoelectric conversion portion.

The penetration wiring may block introduction of light or charges from an outer portion of the unit pixel.

The penetration wiring may be formed from the first or second side of the semiconductor layer by using deep trench isolation (DTI).

An outer portion of the penetration wiring may include a thin layer that contacts the semiconductor layer and that is configured of a dielectric material, and an inside of the penetration wiring may be formed of a conductive material that transmits electrical signals from the organic photoelectric conversion portion.

The outer portion of the penetration wiring may be formed of a material having a lower refractive index than that of a material used to form the semiconductor layer.

According to another aspect of the inventive concept, there is provided an image processing device including: a pixel array that includes a plurality of unit pixels and that generates electrical signals by converting incident light; and a signal processing unit that generates image data by receiving the electrical signals, wherein each of the plurality of unit pixels includes: a semiconductor layer including a first side and a second side that faces the first side in a second direction; an organic photoelectric conversion portion that is formed on the second side of the semiconductor layer in the first direction and that converts light in a first wavelength band into electrical signals; a substrate that is disposed on the first side of the semiconductor layer in a second direction and that includes a pixel circuit; and a penetration wiring that penetrates the semiconductor layer and that electrically connects the organic photoelectric conversion portion and the pixel circuit.

The image processing device may further include a color filter layer through which light in a second wavelength band of light that is not converted by the organic photoelectric conversion portion into electrical signals passes, wherein the semiconductor layer further includes a photodetector that is formed in the semiconductor layer and contacts the first side of the semiconductor layer and that accumulates charges according to the intensity of light that passes through the color filter layer.

The penetration wiring may be formed from the first or second side of the semiconductor layer by using deep trench isolation (DTI).

An outer portion of the penetration wiring may include a thin layer that contacts the semiconductor layer and that is configured of a dielectric material, and an inside of the penetration wiring may be formed of a conductive material that transmits electrical signals from the organic photoelectric conversion portion.

Each of the plurality of unit pixels may sense light in at least two wavelength bands.

BRIEF DESCRIPTION OF THE DRAWINGS

Exemplary embodiments of the inventive concept will be more clearly understood from the following detailed description taken in conjunction with the accompanying drawings in which:

FIG. 2A is a cross-sectional diagram further illustrating a unit pixel on which a first organic photoelectric conversion portion is stacked according to an embodiment of the inventive concept;

FIG. 2B is a three-dimensional conceptual diagram further illustrating the unit pixel of FIG. 2A;

FIGS. 9A, 9B and 9C illustrate the effect of stacking organic photoelectric conversion portions in a first direction of a semiconductor layer including a photodiode according to an embodiment of the inventive concept;

DETAILED DESCRIPTION OF EMBODIMENTS

Figure 1:
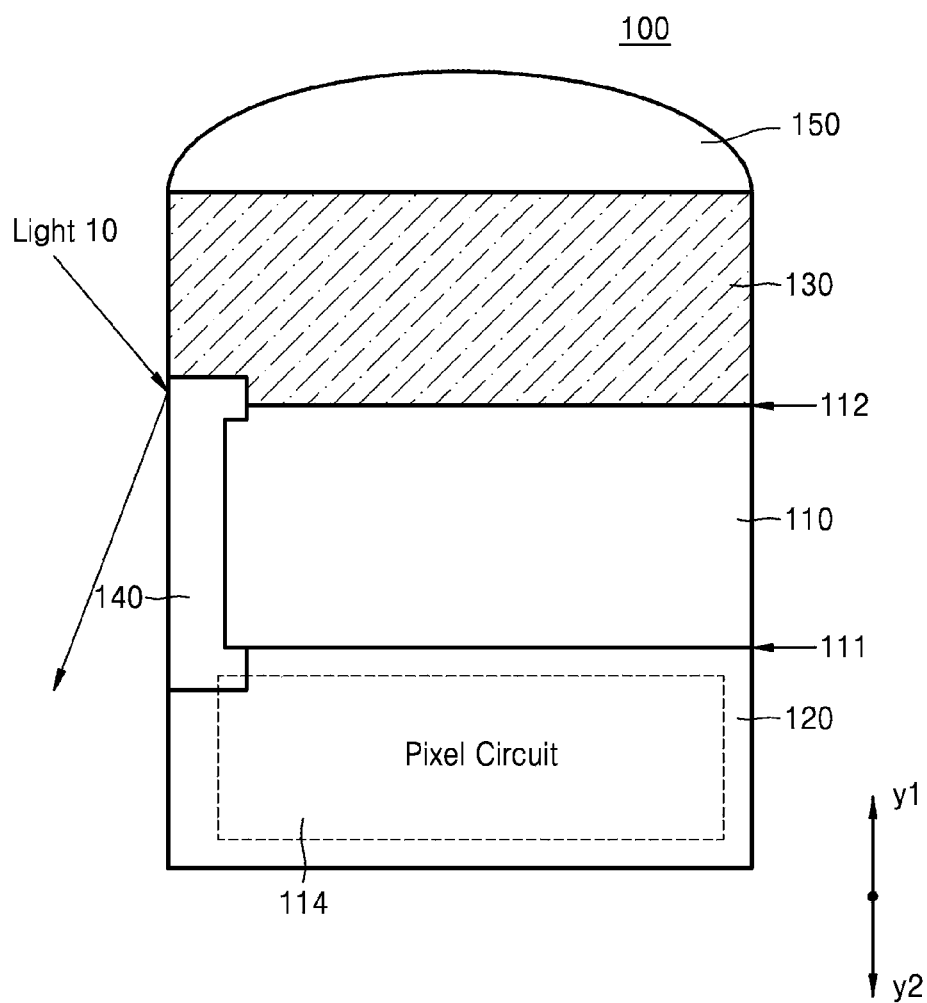
FIG. 1 is a cross-sectional diagram illustrating a unit pixel that may be included in an image sensor according to an embodiment of the inventive concept.

Embodiments of the inventive concept will now be described more fully with reference to the accompanying drawings. The inventive concept may, however, be embodied in many different forms and should not be construed as being limited to only the illustrated embodiments. Rather, these embodiments are provided so that this disclosure will be thorough and complete, and will fully convey the concept of the inventive concept to those skilled in the art. In the drawings, like reference numerals and labels refer to like or similar elements. In the accompanying drawings, the size of certain elements and/or the relative sizes respective elements may have been enlarged, reduced, or altered to improve clarity of the illustration.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure (FIG. 1 is a cross-sectional diagram illustrating a unit pixel 100 that may be incorporated in an image sensor according to embodiments of the inventive concept.

As illustrated in FIG. 1, the unit pixel 100 comprises; a semiconductor layer 110, a transistor layer 120, an organic photoelectric conversion portion 130, a penetration wiring 140, and a lens layer 150. The semiconductor layer 110 includes a first side (or a lower surface) 111 and an opposing second side (or an upper surface) 112, where the transistor layer 120 is disposed on the first side 111 of the semiconductor layer 110. The semiconductor layer 110 and/or transistor layer 120 may be provided as a bulk substrate, an epitaxial substrate, or a silicon-on-insulator (SOI) substrate, for example. The semiconductor layer 110 may also be referred to as a dielectric layer. Although not shown in FIG. 1, the lens layer 150 may include (or be disposed in relation to) one or more color filter(s).

Hereinafter with reference to FIG. 1, the term "first direction" refers to the "y1" or upward direction, and the term "second direction" refers to the opposite "y2" or downward direction. Of course, the terms upward and downward are arbitrary in their definition and merely serve to facilitate the description of the illustrated embodiments. Actual physical embodiments of the inventive concept may include unit pixels have many different fabrication and/or layout orientations.

The semiconductor layer 110 may include a photodetector (PD), where the photodetector may be disposed in contact with the first side 111 of the semiconductor layer 110. (One example of photodetector disposition may be seen in FIG. 2A). According to certain embodiments of the inventive concept, the photodetector may be provided as a photodiode capable of generating an electrical charge in response to the absorption of light incident to the lens layer 150 (hereafter, "incident light"). During operation, a charge path connecting the photodetector with an external circuit is blocked during time periods wherein the photodetector PD absorbs the incident light. The amount of charge accumulated by the photodetector increases according to the intensity of the incident light absorbed by the photodetector. Thus, the intensity of the absorbed light may be detected by the amount of charge accumulated by the photodetector during a predetermined time.

In certain embodiments of the inventive concept, the semiconductor layer 110 will include vias, conductive patterns, metal lines, and associated dielectric and insulating layers and regions variously used to connect the transistor layer 120, organic photoelectric conversion portion 130, and/or photodetector. These elements and their provision in a unit pixel are conventionally understood and will not be described in detail.

According to certain embodiments of the inventive concept, the penetration wiring 140 may be fabricated using a trench isolation technique. Trench isolation techniques include, as examples, shallow trench isolation (STI) techniques and deep trench isolation (DTI) techniques, depending on depth of the particular trenches to be formed. Isolation structures provided by the use of STI and DTI techniques do not usually include undesirable "bird beak(s)", as compared with isolation structures provided using local oxidation of silicon (LOCOS) techniques. As a result, an active region disposed in the substrate proximate the STI/DTI formed isolation structures are not eroded.

The penetration wiring 140 may be provided using one or more DTI techniques applied to a region extending between the first side 111 and second side 112 of the semiconductor layer 110.

According to certain embodiments of the inventive concept, the penetration wiring 140 may serve to (e.g.) electrically connect the organic photoelectric conversion portion 130 with a pixel circuit 114 disposed in the transistor layer 120. This electrical connection is effectively achieved by having the penetration wiring 140 laterally "penetrate" into semiconductor layer 110 at points where the semiconductor layer 110 is vertically stacked between the organic photoelectric conversion portion 130 and transistor layer 120. Here, the terms lateral and vertical are arbitrarily used in the context of the illustrated example of FIG. 1.

The penetration wiring 140 may be formed using one or more electrically conductive materials, such as a metal (e.g., tungsten, aluminium, and/or copper) and/or doped silicon, so as to secure a desired conductivity for the (DTI-formed) penetration wiring 140 so as to effectively transfer electrical signals from the organic photoelectric conversion portion 130 to the transistor layer 120 through the semiconductor layer 110, without allowing excessive electrical charge to pass into the semiconductor layer 110. Thus, according to certain embodiments of the inventive concept, an outer portion of the penetration wiring 140 will include at least one dielectric material, such as $SiO_2$, SiN, $Al_2O_3$, or HfOx, that will insulate the penetration wiring 140 from other silicon substrates, such as the semiconductor layer 110. This approach allows sensor operations to be more precisely performed.

The outer portion of the penetration wiring 140 may also be formed of a material having a different refractive index than the material(s) forming the semiconductor layer 110. For example, assuming that the semiconductor layer 110 is formed from silicon (Si), the outer portion of the penetration wiring 140 might be formed from one or more materials having lower refractive indexes than that of silicon, such as, for example, an oxide and/or a nitride.

In this regard, the penetration wiring 140 used in embodiments of the inventive concept may be used to block (or partially block) the introduction of light and/or electrical charge from lateral side surfaces of the unit pixel 100. Here, the term "lateral side surfaces" is arbitrarily used in the context of the substantially vertical arrangement (i.e., bottom to top surfaces) of elements forming the unit pixel 100, as shown in FIG. 1.

Using this approach in an array of unit pixels 100 forming an image sensor, for example, it is possible to eliminate (or greatly reduce) the amount of light 10 made incident to a unit pixel from a side surface, as well as the amount of electrical charge leaking amongst adjacent or proximate unit pixels. As shown in FIG. 1, the potentially interfering light 10 incident from the direction of an adjacent unit pixel (i.e., from an angle not substantially orthogonal to an upper surface of the lens later 150) may be effectively reflected by the outer portion of the penetration wiring 140. Thus, the outer portion of the penetration wiring 140 may be formed of a material having a lower refractive index than that of the material used to form the semiconductor layer 110. Then, when the "incidence angle" of light 10 incident onto the penetration wiring 140 is relatively larger than a defined "critical angle", the light 10 will be reflected by the outer portion of the penetration wiring 140 away from the semiconductor later 110.

As suggested by the embodiment illustrated in FIG. 1, the transistor layer 120 may include one (or more) pixel circuit 114, each including one or more transistors controlling the operation of the photodetector and/or the organic photoelectric conversion portion 130.

According to certain embodiments of the inventive concept, the organic photoelectric conversion portion 130 is vertically stacked "above" (in the first direction y1 "above") on the semiconductor layer 110 including a photodetector. Thus, at least one pixel circuit may be vertically stacked "below" (in the second direction y2) the semiconductor 110 in the transistor layer 120, and used to generate an output signal(s) upon receiving electrical signal(s) from the organic photoelectric conversion portion 130 and/or the photodetector.

Although not shown in FIG. 1, the unit pixel 100 may further include an insulating layer disposed on the second side 112 of the semiconductor layer 110. In this case, the insulating layer may be a passivation layer for the semiconductor layer 110. Alternately or additionally, the insulating layer may prevent scattering or reflection of the incident light. In certain embodiments, one or more color filter layers (not shown in FIG. 1) may be disposed on the second side 112, as will be described below.

Thus, according to certain embodiments of the inventive concept, at least one organic photoelectric conversion portion 130 will be stacked on the second side 112 of the semiconductor layer 110 in the first direction y1. The organic photoelectric conversion portion 130 may include a color selection layer having a characteristic of photoelectric conversion with respect to light having a particular range (or "band") of wavelengths. For example, incident light having a particular wavelength band may be described as green (G) light, red (R) light, or blue (B) light.

The semiconductor layer 110 (including a photodetector) and the organic photoelectric conversion portion 130 are arranged in a stacked structure in such a manner that the number of required layer stacking processes may be reduced and light-conversion efficiency improved. More detailed structures and exemplary materials for the semiconductor layer 110 and organic photoelectric conversion portion 130 will be set forth below. Of note, however, the organic photoelectric conversion portion 130 should be stacked on the semiconductor layer 110 such that area occupied by the unit pixel 100 can be reduced, thereby allowing a plurality of unit pixels associated with different light color to be efficiently arranged in an array of pixel units.

FIG. 2A is a cross-sectional diagram further illustrating in one example the unit pixel 100 of FIG. 1 in which the organic photoelectric conversion portion 130 is efficiently stacked on the semiconductor layer 100 according to certain embodiments of the inventive concept.

As illustrated in FIG. 2A, the unit pixel 100 again comprises the semiconductor layer 110, transistor layer 120, penetration wiring 140, and lens layer 150 as previously described in relation to FIG. 1. However, in the example illustrated in FIG. 2, the unit pixel 100 further includes a color filter layer 160 disposed on a second side 112 of the semiconductor layer 110. The organic photoelectric conversion portion 130 more specifically comprises; a first lower electrode 132, a first color selection layer 131, and a first upper electrode 133, sequentially stacked on the color filter layer 160 in the first direction y1.

The first lower electrode 132 may be formed of a transparent oxide electrode material, for example, a transparent conductive material, such as ITO, IZO, ZnO, or $SnO_2$. Alternatively, the first lower electrode 132 may be formed as a metal thin layer, for example, a semitransparent electrode having a thickness of less than 20 nm. The metal thin layer may be formed of at least one material among Al, Cu, Ti, Au, Pt, Ag, and Cr. The first upper electrode 133 may also be formed as a transparent oxide electrode having a work function that is greater than or equal to the work function of the first lower electrode 132. For example, the first upper electrode 133 may be formed of a transparent conductive material, such as ITO, IZO, ZnO, or $SnO_2$. The first upper electrode 133 and the first lower electrode 132 may be arranged to apply electrical bias voltages to the organic photoelectric conversion portion 130. Thus, the first upper electrode 133 and the first lower electrode 132 may correspond to a cathode and an anode of the organic photoelectric conversion portion 130, respectively. The first upper electrode 133 and the first lower electrode 132 may serve to communicate electrical signal(s) that are accumulated/converted in the first color selection layer 131 to the transistor layer 120. The area of the first upper electrode 133 and the area of the first lower electrode 132 should be maximized so that transmission of the electrical signals may be maximized. Other upper electrodes and other lower electrodes described hereafter may play a role in the above described functionality.

The first color selection layer 131 may be used to convert incident light into corresponding electrical signals using a photoelectric effect and may be formed of an organic material. The first color selection layer 131 may be configured to include a P-type layer having holes as a main carrier, and an M-type layer having electrons as a main carrier. The first color selection layer 131 may be used to generate electrical signals from green (G) light among other light components, for example. However, this is just an example, blue or red light may be photo-electrically converted in similar manner. The incident light that passes through the organic photoelectric conversion portion 130, other than green light in the working example, may pass through the color filter layer 160 without damage. However, embodiments of the inventive concept are not limited thereto, and blue or red light may be photo-electrically converted in similar manner.

According to an embodiment of the inventive concept, the color filter layer 160 may be stacked on or adjacent to the second side 112 of the semiconductor layer 110. Only one (the secondary light component) of the light components (G, R, B) other than the light component being converted by the organic photoelectric conversion portion 130 into electrical signals (the primary light component), may pass through the color filter layer 160. That is, when the electrical signals are generated by the organic photoelectric conversion portion 130 from green light—the primary light component of the unit pixel, for example, either blue light or red light—as the secondary light component—may pass through the color filter layer 160.

In the example illustrated in FIG. 2, the semiconductor layer 110 is shown as including a photodetector (PD) 113 disposed on the first side 111 of the semiconductor layer 110. Here, the photodetector 113 accumulates electrical charge by absorbing the secondary light component of the incident light passing through the color filter layer 160, for example, red light. However, the amount of charge may be stacked by absorbing blue light, for example, and the secondary light component passing through the color filter layer 160 will vary according to the primary light component selected by the first color selection layer 131 of the organic photoelectric conversion portion 130.

The DTI-formed penetration wiring 140 may be configured to include a conducting wire portion 141 and an insulation portion 142. The conducting wire portion 141 will have a conductivity sufficient to transmit an first electrical signal provided by the organic photoelectric conversion portion 130 to the transistor layer 120. Thus, according to certain embodiments of the inventive concept, the conducting wire portion 141 may be formed of one or more conductive materials, such as a metal (e.g., tungsten, aluminum, or copper) and/or doped silicon.

However, the penetration wiring 140 should prevent potentially interfering electrical signals from flowing from a surrounding layer or region through the semiconductor layer 110. Therefore, according to certain embodiments of the inventive concept, the insulation portion 142 or "outer portion" of the penetration wiring 140 may be formed using DTI techniques using one or more dielectric material(s), such as $SiO_2$, SiN, $Al_2O_3$, or HfOx, so that the penetration wiring 140 may be insulated from other silicon substrates, such as the semiconductor layer 110 and thus may perform a sensor operation more precisely.

Also, the insulation portion 142 may be formed of a material having a different refractive index from that of the material used to form the semiconductor layer 110. For example, when the material used to form the semiconductor layer 110 is Si, the insulation portion 142 may be formed of materials having lower refractive indexes than that of Si, for example, oxide, nitride, and the like.

According to an embodiment of the inventive concept, the insulation portion 142 may be used to block the introduction of light or electrical charge being potentially communicated from side surfaces of the unit pixel 100. That is, the light incident onto the unit pixel 100 from a direction of an adjacent unit pixel, as well as electrical charge migrating from all of the surrounding unit pixels may be blocked by use of the insulation portion 142 of the penetration wiring 140. As shown in FIG. 2A, the light incident onto other adjacent unit pixels illustrated in FIG. 1 may be reflected and incident onto the penetration wiring 140 of the unit pixel 100 of FIG. 2A. In this case, the insulation portion 142 may be formed of a material having a lower refractive index than that of the material used to form the semiconductor layer 110. Thus, when an incidence angle of light 10 onto the insulation portion 142 is larger than a critical angle, the light 10 may be reflected from the insulation portion 142 due to total reflection.

The transistor layer 120 may include at least one pixel circuit 114 capable of receiving and amplifying the electrical signal(s) generated by the organic photoelectric conversion portion 130 and/or the photodetector PD.

FIG. 2B is a three-dimensional conceptual diagram further illustrating the relative lateral and vertical arrangements of FIG. 2A according to embodiments of the inventive concept. Here again, the terms "lateral" and "vertical" are arbitrarily used in the context of the illustrated examples shown in FIGS. 2A and 2B.

Referring to FIG. 2B, the semiconductor layer 110 including the photodetector 113 is vertically stacked (in the first direction y1) on the transistor layer 120 that includes the pixel circuit 114. The color filter layer 160 is vertically stacked on the semiconductor layer 110. However, as previously noted, an insulating layer (not shown) may be stacked between the color filter layer 160 and semiconductor layer 110. The insulating layer may be a passivation layer or may be used to prevent scattering or reflection of incident light. The organic photoelectric conversion portion 130 is vertically stacked on the color filter layer 160.

The DTI-formed penetration wiring 140 is disposed lateral to a portion of (or vertically extends through) the semiconductor layer 110 so as to transmit electrical signals generated by the organic photoelectric conversion portion 130 to the transistor layer 120. An inner portion of the penetration wiring 140 is formed of conductive material(s) so that the electrical signals may flow through the penetration wiring 140. An outer portion of the penetration wiring 140 is formed of dielectric or insulating material(s) so that stray electrical signals will not pass through the penetration wiring 140 into the semiconductor layer 110.

The outer portion of the penetration wiring 140 may be formed of material(s) having a lower refractive index than that of the material(s) used to form the semiconductor layer 110 so that light reflected from adjacent unit pixels or charges generated from adjacent unit pixels will be blocked and optical/electrical crosstalk may be prevented. However, this is just an example and is not limited to light or charges from other adjacent unit pixels and may correspond to light or charges from an outer portion of the unit pixel.

Figure 3:
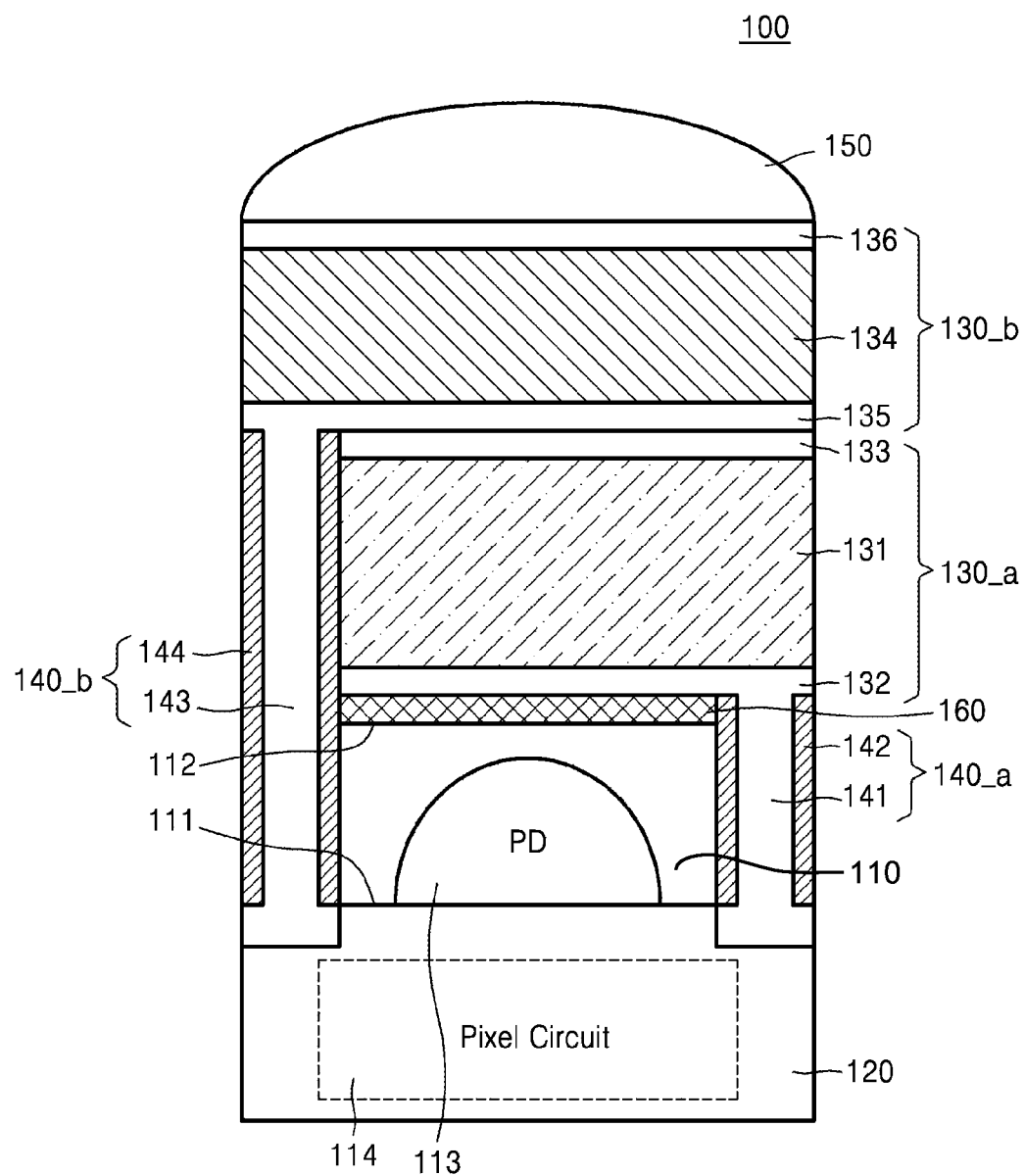
FIG. 3 is a cross-sectional diagram illustrating an image sensor that further includes a second organic photoelectric conversion portion and a second penetration wiring according to an embodiment of the inventive concept.

FIG. 3 is another cross-sectional diagram illustrating the unit pixel 100 similar to that of FIGS. 1 and 2A, except the unit pixel 100 of FIG. 3 further comprises; a second organic photoelectric conversion portion 130_b, and a second penetration wiring 140_b according to certain embodiments of the inventive concept.

Referring to FIG. 3, the unit pixel 100 again comprises the semiconductor layer 110, transistor layer 120, first penetration wiring 140_a, lens layer 150, and color filter layer 160 disposed on the second side 112 of the semiconductor layer 110 in a first direction y1. The first organic photoelectric conversion portion 130_a again includes the first lower electrode 132, first color selection layer 131, and first upper electrode 133 collectively disposed on the color filter layer 160.

However, the unit pixel 100 of FIG. 3 further comprises the second organic photoelectric conversion portion 130_b and second penetration wiring 140_b. The second organic photoelectric conversion portion 130_b may be vertically stacked on the first organic photoelectric conversion portion 130_a in the first direction y1 and may include a second lower electrode 135, a second color selection layer 134. Here, the second color selection layer 134 will provide another (a $2^{nd}$) secondary light component conversion with respect to the light components (G, B or R). An insulating layer (not shown) may be formed between the first organic photoelectric conversion portion 130_a and the second organic photoelectric conversion portion 130_b. Also, a passivation layer (not shown) may be further provided on the second organic photoelectric conversion portion 130_b.

The second lower electrode 135 may be formed of a transparent oxide electrode material, a metal thin layer, or an electrode material that may be employed in the first lower electrode 132. The second upper electrode 136 may have a work function that is greater than or equal to the work function of the second lower electrode 135 and may be formed of an electrode material as employed in the first upper electrode 133.

The second color selection layer 134 may be used to convert the second secondary light component (e.g., blue light) into electrical signals using a photoelectric effect and may be formed of an organic material. However, this is just an example, and the second secondary color selection layer 134 may be formed of a material that photoelectrically converts a green or red component of light. The foregoing designation of primary, first secondary and second secondary light components is made with reference to the former embodiments described in relation to FIGS. 1 and 2A. Such naming designations are completely arbitrary as may be seen from the description that follows.

The second penetration wiring 140_b according to the embodiment illustrated in FIG. 3 comprises a second conducting wire portion 143 and a second insulation portion 144. As described above, the second penetration wiring 140_b may have the same configuration as that of a conducting wire portion 141 and a first insulation portion 142, of the first penetration wiring 140_a. However, since the second penetration wiring 140_b may penetrate the first organic photoelectric conversion portion 130_a, the second insulation portion 144 of the second penetration wiring 140_b may be formed of a material having a lower refractive index than that of a material used to form the first organic photoelectric conversion portion 130_a. Thus, incident light may be reflected from the second insulation portion 144.

Exemplary operation of the image sensor including the unit pixel 100 of FIG. 3 is described below. White light including all three of the green, red and blue light components is assumed to be incident onto the lens layer 150. A primary light component (e.g., green) is selected from the white incident light by the second organic photoelectric conversion portion 130_b, and a first secondary light component (e.g., blue) is selected from the residual incident light passing through the second organic photoelectric conversion portion 130_b. Each of these light components is converted into a corresponding electrical signal.

That is, the second organic photoelectric conversion portion 130_b may generate electrical charge by absorbing energy of the primary (e.g., green) light component of the incident light, and the first organic photoelectric conversion portion 130_a may generate electrical charge by absorbing the first secondary (e.g., blue) light component of the incident light. The charge generated by the first color selection layer 131 and the second color selection layer 134 move to the first lower electrode 132 and the second lower electrode 135, respectively. Each of the resulting electrical signals may then be communicated to the pixel circuit 114 of the transistor layer 120 via the first penetration wiring 140_a and the second penetration wiring 140_b, respectively.

Finally, the second secondary (e.g., red) light component of the incident light not converted by the first organic photoelectric conversion portion 130_a or the second organic photoelectric conversion portion 130_b, will pass through the color filter layer 160 and will then be converted by the photodetector 113 into corresponding charge. The accumulated charge may then be communicated to the pixel circuit 114 of the transistor layer 120.

Figure 4:
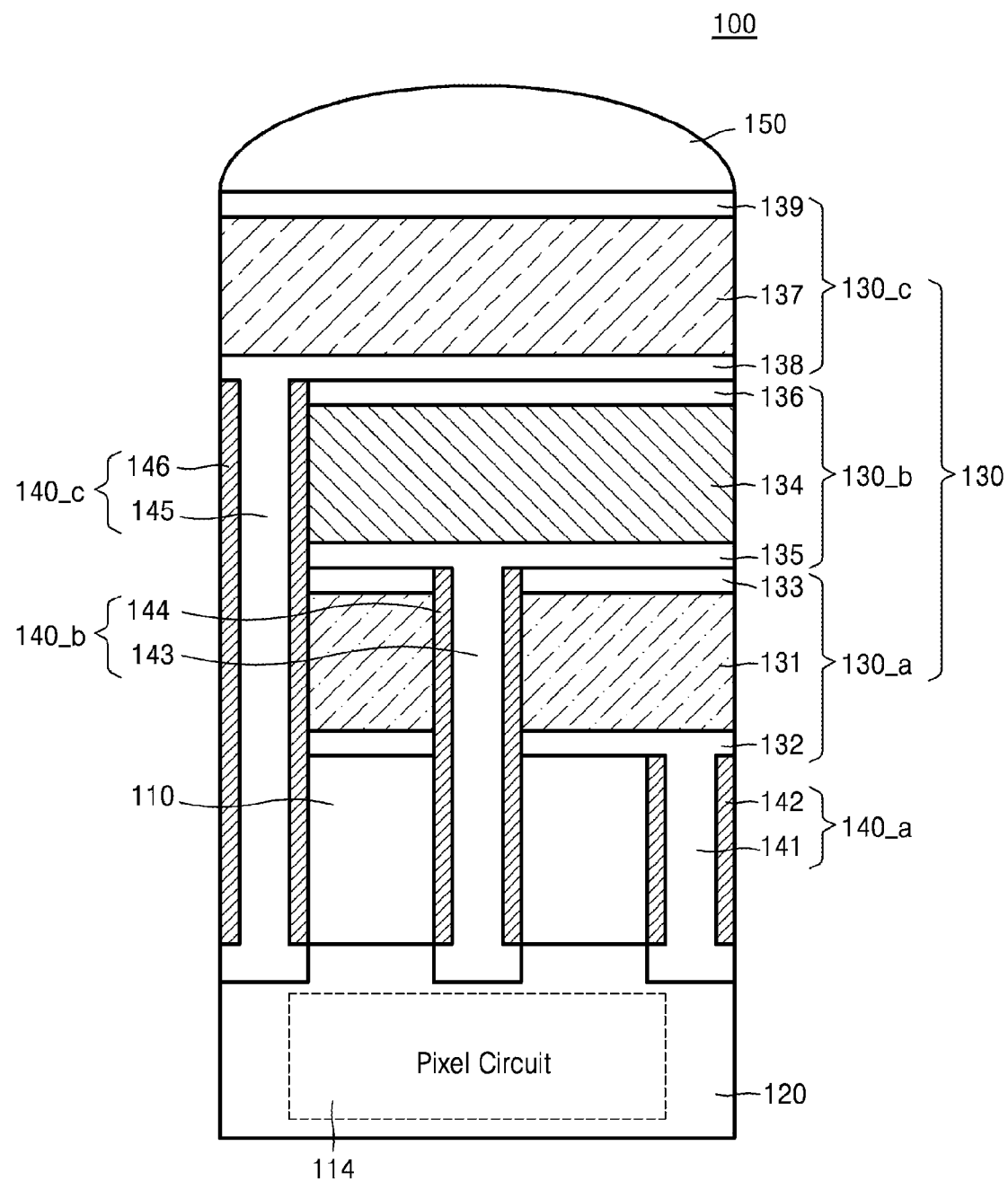
FIG. 4 is a cross-sectional diagram illustrating an image sensor that further includes a third organic photoelectric conversion portion and a third penetration wiring according to an embodiment of the inventive concept.

FIG. 4 is yet another cross-sectional diagram illustrating a unit pixel 100 of an image sensor that further comprises a third organic photoelectric conversion portion 130_c, as compared with the unit pixel of FIG. 3, and thus further comprises a third penetration wiring 140_c, according to certain embodiments of the inventive concept.

Referring to FIGS. 3 and 4, the unit pixel 100 comprises the semiconductor layer 110, transistor layer 120, first penetration wirings 140_a, lens layer 150, first organic photoelectric conversion portion 130_a including the first lower electrode 132, the first color selection layer 131, and the first upper electrode 133, second organic photoelectric conversion portion 130_b, and the second penetration wiring 140_b.

Referring to FIG. 4, the unit pixel 100 further comprises a third organic photoelectric conversion portion 130_c and a third penetration wiring 140_c. The third organic photoelectric conversion portion 130_c is formed on the second organic photoelectric conversion portion 130_b in the first direction y1 and may include a third lower electrode 138, a third color selection layer 137 having a characteristic of photoelectric conversion with respect to a light component in a third wavelength band, and a third upper electrode 139. An insulating layer (not shown) may be formed between the second organic photoelectric conversion portion 130_b and the third organic photoelectric conversion portion 130_c. Also, a passivation layer (not shown) may be further provided on the third organic photoelectric conversion portion 130_c.

The third lower electrode 138 may be formed as a transparent oxide electrode material, a metal thin layer, or an electrode material that may be employed in the first lower electrode 132. The third upper electrode 139 as a transparent oxide electrode may have a work function that is larger than or equal to that of the third lower electrode 138 and may be formed of an electrode material that may be employed in the first upper electrode 133.

The third color selection layer 137 may be used to convert light into a corresponding electrical signal using a photoelectric effect and may be formed of an organic material. The third color selection layer 137 may generate electrical signals from a red component of light, for example. However, this is just an example, and the third color selection layer 137 may be formed of a material that photoelectrically converts a green or blue component of light.

The third penetration wiring 140_c according to the current embodiment of the inventive concept includes a third conducting wire portion 145 and a third insulation portion 146. As described above, the third penetration wiring 140_c may have the same configuration of the first penetration wiring 140_a including the first conducting wire portion 141 and the first insulation portion 142. However, since the third penetration wiring 140_c may penetrate the first organic photoelectric conversion portion 130_a and the second organic photoelectric conversion portion 130_b, the third insulation portion 146 of the third penetration wiring 140_c may be formed of a material having a lower refractive index than a refractive index of a material used to form the first organic photoelectric conversion portion 130_a and a refractive index of a material used to form the second organic photoelectric conversion portion 130_b. Thus, incident light may be reflected from the third insulation portion 146.

During operation of an image sensor including the unit pixel 100 of FIG. 4, white light is again assumed to be incident onto the lens layer 150. A "third" color component may be selected and converted by the third organic photoelectric conversion portion 130_c, a "second" color component may be selected and converted by the second organic photoelectric conversion portion 130_b, and a "first" color component may be selected and converted by the first organic photoelectric conversion portion 130_a. For example, the third organic photoelectric conversion portion 130_c may generate electrons and holes by absorbing energy of the green component of the incident light, the second organic photoelectric conversion portion 130_b may generate electrons and holes by absorbing the blue component of the incident light, and the first organic photoelectric conversion portion 130_a may generate electrons and holes by absorbing the red component of the incident light. The electrons or holes of the first color selection layer 131, the second color selection layer 134, and the third color selection layer 137 may be moved to the first lower electrode 132, a second lower electrode 135, and the third lower electrode 138 and may be transmitted to a pixel circuit of the transistor layer 120 via the first penetration wiring 140_a, the second penetration wiring 140_b, and the third penetration wiring 140_c.

Thus, according to the embodiment of the inventive concept illustrated in FIG. 4, instead of using a photodetector disposed in the semiconductor layer 110 and its associated vias and metal lines for connecting the transistor layer 120, a third organic photoelectric conversion portion 130_c may be used.

Figure 5:
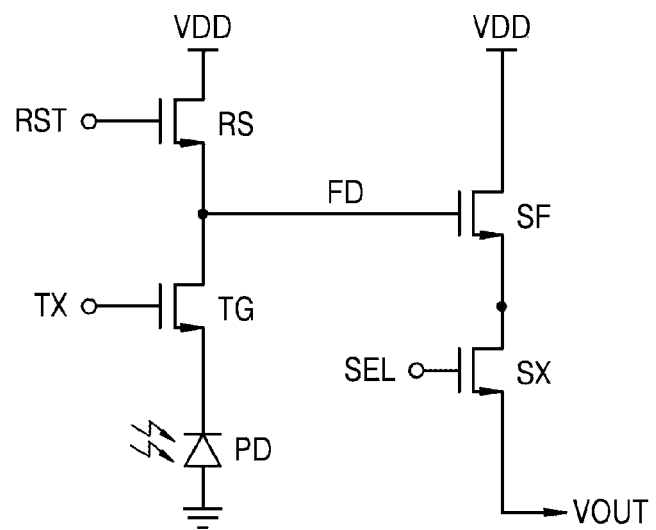
FIGS. 5 and 6 illustrate pixel circuits according to embodiments of the inventive concept.
Figure 6:
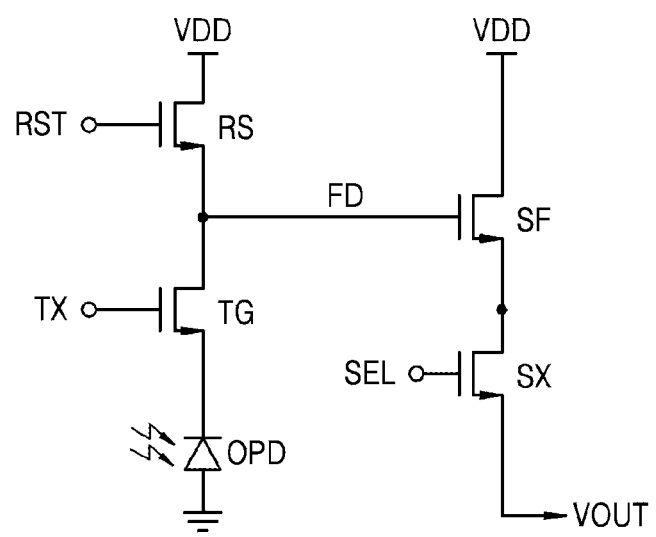

FIGS. 5 and 6 are equivalent circuit diagrams further illustrating unit pixels consistent with certain embodiments of the inventive concept.

Referring to FIG. 5, an organic photoelectric conversion portion is stacked on a semiconductor layer including the photodetector PD in a first direction y1. Thus, at least one pixel circuit that generates output signals by receiving electrical signals from the organic photoelectric conversion portion and the photodetector PD of the semiconductor layer may be included in a transistor layer.

Each pixel circuit included in a pixel array of a complementary metal-oxide semiconductor (CMOS) image sensor may include an element that amplifies electrical signals generated by the photodetector PD. The pixel circuit is referred to as an active pixel sensor (APS). For example, a unit pixel may include a photodetector PD, a transmission transistor TG, a reset transistor RS, a source-follower transistor SF, and a selection transistor SEL. When the photodetector PD, which is a kind of a photodetector having a characteristic that a photocurrent increases linearly according to the intensity of input light in a reverse bias voltage state, is exposed to light and is electrically blocked from the outside (floats), electrons may be accumulated on the photodetector PD. As the electrons accumulate on the photodetector PD, a cathode voltage of the photodetector PD may be reduced, and the reduced voltage may be measured so that the intensity of light absorbed by the photodetector PD may be detected. Such accumulation of electrons may also be described as a discharge operation of a capacitor charged by the generated photocurrent.

The transmission transistor TG may connect the photodetector PD to a floating diffusion FD or may block the photodetector PD from the outside according to a gate voltage. While the photodetector PD accumulates electrons in response to light, a voltage that may turn off the transmission transistor TG may be applied to a gate of the transmission transistor TG so that the photodetector PD and the floating diffusion FD may be electrically blocked from each other. If the photodetector PD completes absorption of light, the transmission transistor TG may be turned on so as to output a change in voltages caused by the electrons accumulated on the photodetector PD and thus a voltage change at a cathode of the photodetector PD may be transmitted to the floating diffusion FD.

Before the voltage of the photodetector PD is transmitted to the floating diffusion FD, the floating diffusion FD may be reset by the turned-on reset transistor RS. A reset voltage of the floating diffusion FD may be amplified via the source-follower transistor SF and may be output to the outside if the selection transistor SEL is turned on. A read circuit may receive an analog voltage corresponding to the reset voltage of the floating diffusion FD that is output to the outside.

If the output of the reset voltage of the floating diffusion FD is completed, the reset transistor RS is turned off, and the transmission transistor TG is turned on so that the voltage caused by the electrons accumulated on the photodetector PD may be transmitted to the floating diffusion FD. Like the reset voltage of the floating diffusion FD, the voltage change of the floating diffusion FD may be output to the outside as VOUT via the source-follower transistor SF and the selection transistor SFL. An analog voltage VOUT corresponding to the change in the output voltage of the floating diffusion FD may be transmitted to an external read circuit (not shown).

The read circuit may calculate the amount of light detected by the photodetector PD by using a difference between the reset voltage of the floating diffusion FD and the voltage caused by the photodetector PD. Such an operation is referred to as correlated double sampling (CDS), and an order in which the reset voltage and the voltage caused by the photodetector PD are received may be changed. In FIG. 5, the pixel circuit includes a N-channel metal-oxide semiconductor (NMOS) transistor. However, this is just an example, and the pixel circuit may include a P-channel MOS (PMOS) transistor.

Referring to FIG. 6, in an embodiment of the pixel circuit of FIG. 4 as a pixel circuit including an organic photoelectric conversion portion OPD, the organic photoelectric conversion portion OPD that may replace the photodetector PD, may convert a light component in a particular wavelength into electrical signals. The other operations are the same as those of the pixel circuit including the photodetector PD described above and thus will be omitted. In a structure in which the organic photoelectric conversion portion OPD and the photodetector PD are stacked, the pixel circuit including the organic photoelectric conversion portion OPD and the pixel circuit including the photodetector PD may be separately designed. However, when the organic photoelectric conversion portion OPD and the photodetector PD are not stacked, the pixel circuit including the organic photoelectric conversion portion OPD and the pixel circuit including the photodetector PD may be designed together. Also, the pixel circuit including the organic photoelectric conversion portion OPD is not limited to FIG. 6 and may be configured without the transmission transistor TG.

Figure 7:
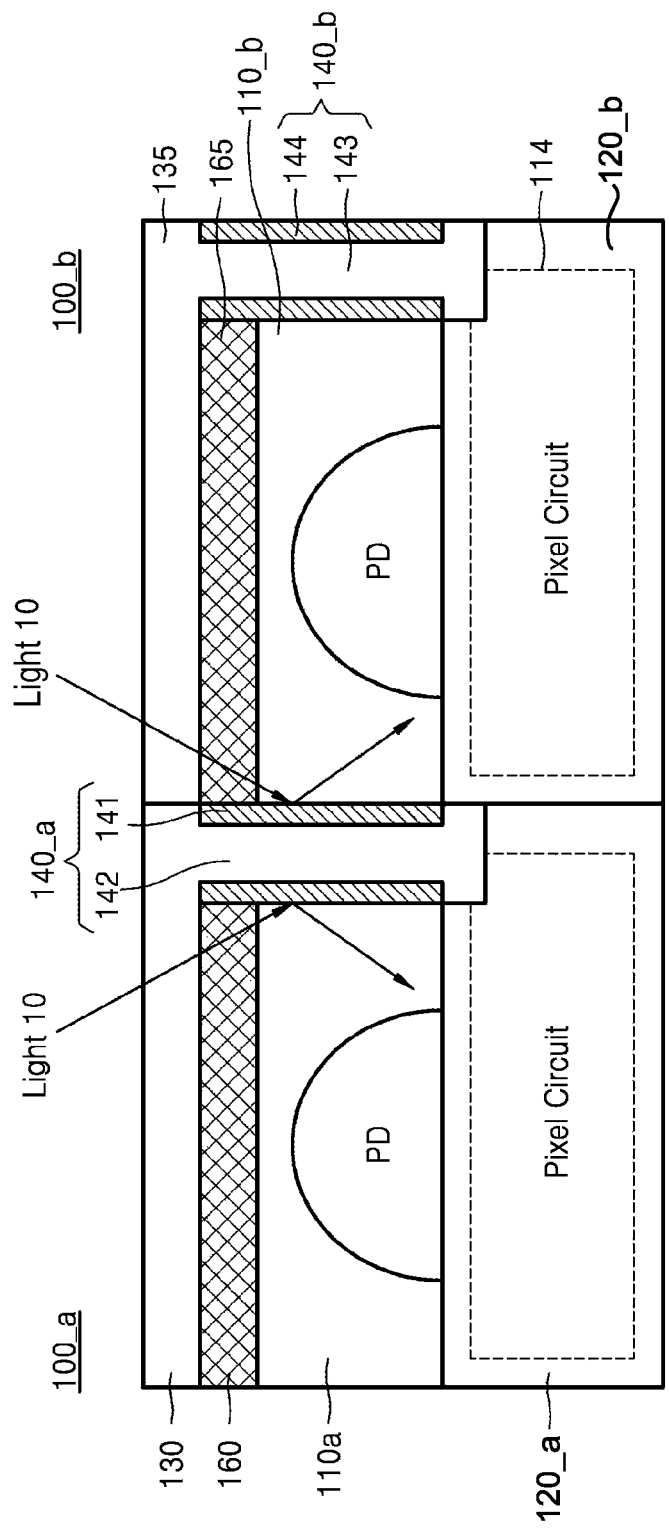
FIG. 7 is a cross-sectional diagram illustrating an arrangement of a first unit pixel and a second unit pixel according to an embodiment of the inventive concept.

FIG. 7 is a cross-sectional diagram further illustrating one possible arrangement for a first unit pixel 100_a and a second unit pixel 100_b according to embodiments of the inventive concept.

As illustrated in FIG. 7, the first unit pixel 100_a comprises; a first organic photoelectric conversion portion 130, color filter layer 160, semiconductor layer 110_a, transistor layer 120_a, and first penetration wiring 140_a. Similarly, the second unit pixel 100_b comprises; a second organic photoelectric conversion portion 135, color filter layer 165, semiconductor layer 110_b, transistor layer 120_b, and second penetration wiring 140_b.

In the illustrated embodiment of FIG. 7, a (DTI-formed) first penetration wiring 140_a is vertically disposed as a pixel isolation layer into the semiconductor layers 110_a and 110_b, and thereby may be used to define (or establish) a boundary between pixels disposed laterally adjacent to one another. As before, the first penetration wiring 140_a may be formed of a material having a lower refractive index than refractive indexes of materials used to form the semiconductor layers 110_a and 110_b. Thus, when light incident from the first unit pixel 100_a is incident onto the first penetration wiring 140_a and an incidence angle of the light incident onto the first penetration wiring 140_a is larger than a critical angle, the light may not be incident onto the second unit pixel 100_b due to total reflection. Also, when the light incident from the second unit pixel 100_b is incident onto the first penetration wiring 140_a and an incidence angle of the light incident onto the first penetration wiring 140_a is larger than the critical angle, the light may not be incident onto the first unit pixel 100_a due to total reflection. Thus, optical/electrical crosstalk may be prevented. In an embodiment of the inventive concept, the spirit of the inventive concept may be applied to an array having more unit pixels.

Figure 8:
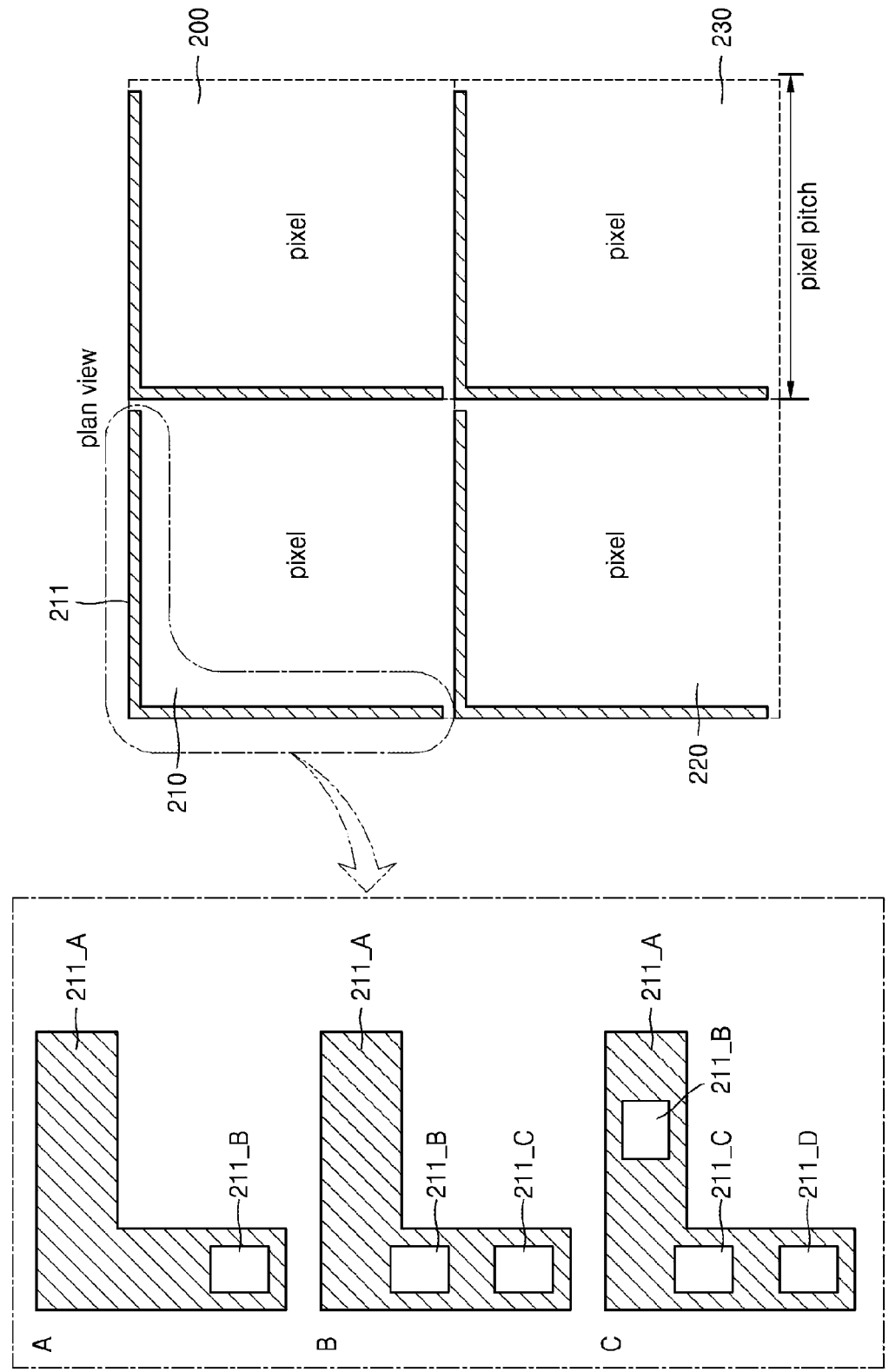
FIG. 8 is a plan view of four adjacent unit pixels according to an embodiment of the inventive concept.

FIG. 8 is a plan view illustrating an arrangement of four (4) adjacent unit pixels according to certain embodiments of the inventive concept.

As illustrated in FIG. 8, four unit pixels 200, 210, 220, and 230 are arranged adjacent to one another in a 2-by-2 pixel array. Certain (DTI-formed) penetration wiring 211 is disposed between vertically and laterally adjacent unit pixels 200, 210, 220, and 230. The penetration wiring 211 may be similar to the penetration wiring 140 described above and may serve as both an optical and an electrical isolation element preventing or reducing optical/electrical crosstalk among the adjacent unit pixels.

When the view of the penetration wiring 211 is enlarged, it may understood as having one of the configurations shown as A, B, and C in FIG. 8. In the configuration A, when only one (1) organic photoelectric conversion portion is disposed in the unit pixel, and one (1) conducting wire portion 211_B may be used to transmit electrical signals to a pixel circuit in a transistor layer. The conducting wire portion 211_B may be formed of one or more of the conductive materials described above, and the other portions of the penetration wiring 211 as an insulation portion 211_A may be formed of a dielectric material, i.e., a material having a lower refractive index than that of a material used to form a semiconductor layer.

In the configuration B, two (2) organic photoelectric conversion portions are disposed in two stacked layers. Hence, two (2) conducting wire portions 211_B and 211_C may be sued to transmit electrical signals to a pixel circuit in the transistor layer. For example, the conducting wire portions 211_B and 211_C may be formed so that the respective organic photoelectric conversion portions convert green and blue components into electrical signals and transmit the electrical signals to the pixel circuit in the transistor layer. The conducting wire portions 211_B and 211_C may be formed from the conductive materials described above, and the other portions of the penetration portion 211 such as an insulation portion 211_A may be formed of a dielectric material, i.e., a material having a lower refractive index than that of the material used to form the semiconductor layer.

In the configuration C, organic photoelectric conversion portions are stacked in three layers. Hence, three (3) conducting wire portions 211_B, 211_C, and 211_D used to transmit electrical signals to the pixel circuit in the transistor layer are provided. For example, the conducting wire portions 211_B, 211_C, and 211_D may be formed so that the three (3) organic photoelectric conversion portions respectively convert green, blue and red components into electrical signals and transmit electrical signals to the pixel circuit in the transistor layer. The conducting wire portions 211_B, 211_C, and 211_D may be formed of the conductive materials described above, and the other portions of the penetration wiring 211 may be formed of a dielectric material, i.e., a material having a lower refractive index than that of the material used to form the semiconductor layer.

Those skilled in the art will recognize that the shapes and sizes of the various conducting wire portions 211_B, 211_C, and 211_D, as well as the configurations A, B, and C of FIG. 8 are merely illustrative. Furthermore, the penetration wiring 211 is not limited to the shape of FIG. 8 and may be continuously implemented by including all sides that contact adjacent unit pixels or may be intermittently implemented at only a portion of the sides that contact adjacent unit pixels. For example, an insulation portion 211_A may be formed only at a portion of peripheries of the conducting wire portions 211_B, 211_C, and 211_D so that the penetration wiring 211 may be implemented.

Figure 9A:
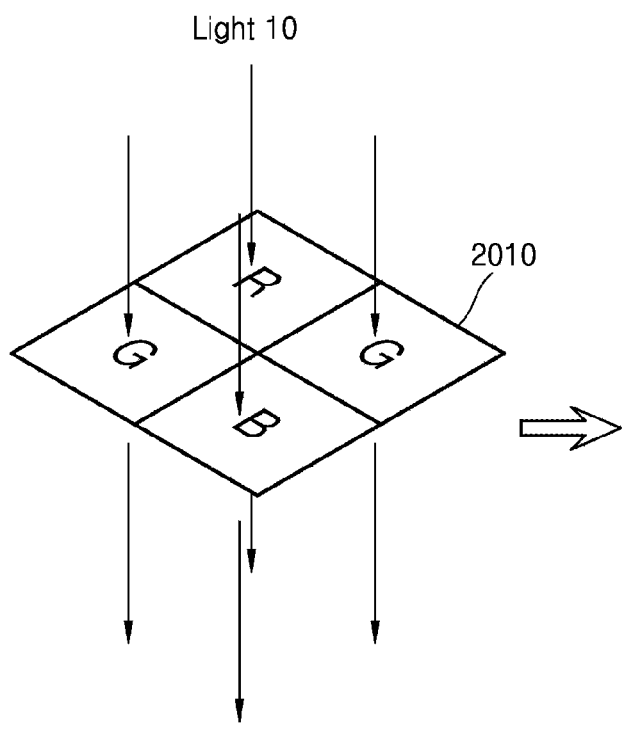
Figure 9B:
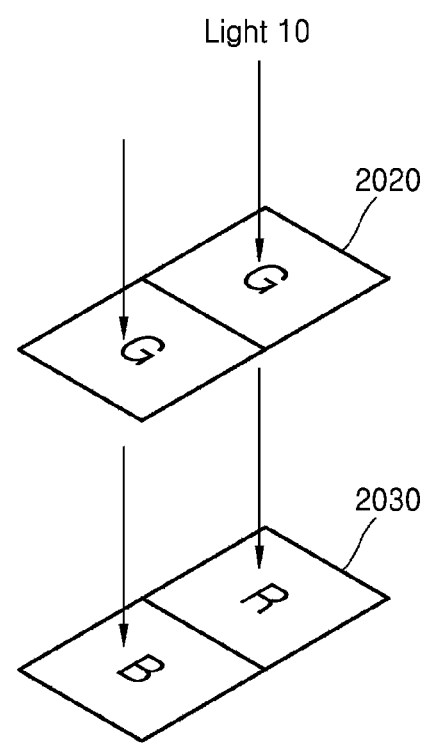

FIGS. 9A, 9B and 9C are conceptual diagrams illustrating the effect of vertically stacking various organic photoelectric conversion portions in relation to a semiconductor layer including a photodetector according to certain embodiments of the inventive concept.

Referring to FIG. 9A, a conventional color filter layer arrangement 2010 includes a plurality of color filter layers (red (R), green (G) and blue (B)) arranged in a given 2-by-2 array pattern (more specifically, a "Bayer pattern"). The Bayer pattern includes 50% green, 25% red, and 25% blue in each four (4) adjacent color filters constituting a 2-by-2 rectangle. A selected light component will pass through only a corresponding color filter layer (i.e., only a red light passes through the red color filter layer R, such that only the red light component is incident onto a underlying photodetector stacked under the color filter layer 2010).

Referring to FIG. 9B, an organic photoelectric conversion portion 2020 consistent with embodiments of the inventive concept may be used to convert a green component of light into electrical signals when vertically stacked over an array of photodetectors. At least certain components of the light 10 will pass through the first organic photoelectric conversion portion 2020 (e.g., as the green light component is converted into electrical signals), such that other light components are made incident onto the photodetectors (e.g., such as those used to convert red and blue components into electrical signals).

Using this type of stacked structures, the (as downward viewed towards the semiconductor layer 110) area occupied by each unit pixel may be reduced. (Compare the planer arrangement of FIG. 9A with the vertically stacked arrangement of FIG. 9B). As a result, the size of a unit pixel may be reduced, and a degree of interpolation of color values of a peripheral unit pixel may be reduced so that a clearer image may be obtained. Thus, the resolution of an image sensor may be enhanced by the same number of unit pixels having the same pixel sizes, as compared for example with the Bayer pattern technique.

Furthermore, all organic photoelectric conversion portions that may convert red, green, and blue into electrical signals, as illustrated in FIG. 4, may be stacked in a unit pixel so that all of red, green, and blue may be represented in one unit pixel.

However, this is just an embodiment of the inventive concept, and embodiments of the inventive concept are not limited thereto, and there may be various stacking techniques, and a light component that is converted by an organic photoelectric conversion portion into electrical signals may vary depending on configuration, and the configuration of a color filter layer caused thereby may vary.

Referring now to FIG. 9C, a first pixel array 2000_a includes the above-described Bayer patterns and may be used to convert only one component of light into electrical signals, and may output color in one pixel. On the other hand, a second pixel array 2000_b has a configuration in which organic photoelectric conversion portions are stacked, so that two or more components of light may be converted into electrical signals and color may be output in one pixel.

Figure 10:
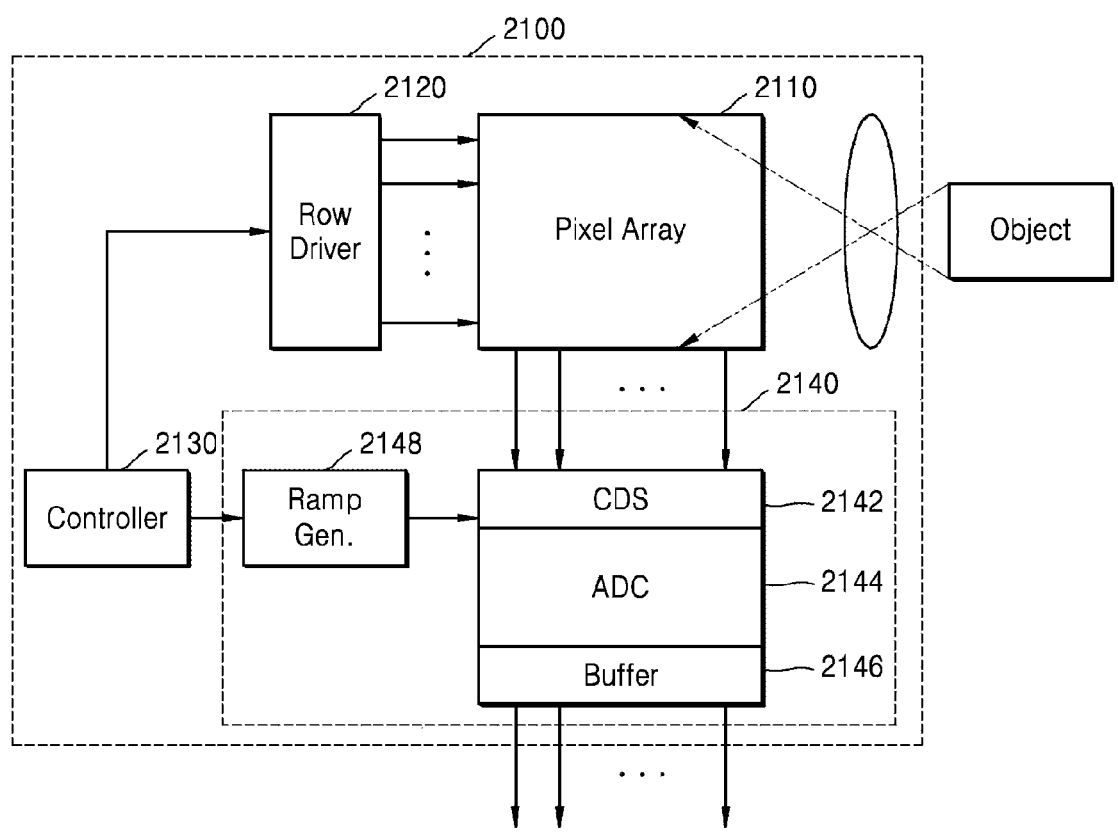
FIG. 10 is a block diagram of a configuration of an image sensor according to an embodiment of the inventive concept.

FIG. 10 is a block diagram illustrating one possible configuration for an image sensor 2100 according to embodiments of the inventive concept.

As illustrated in FIG. 10, the image sensor 2100 comprises; a pixel array 2110, a controller 2130, a row driver 2120, and a pixel signal processing unit 2140. The pixel array 2110 may be configured to include unit pixels according to embodiments of the inventive concept, as described above. Each of the unit pixels may include an organic photoelectric conversion portion and a photodiode in a semiconductor layer. Alternately or additionally, a unit pixel may be configured in such a way that only organic photoelectric conversion portions are stacked. Thus, the size of each unit pixel providing an electrical signal indicative of a color image may be reduced, and a clearer image may ultimately be obtained.

Also, the unit pixel may further include a penetration wiring portion that connects an organic photoelectric conversion portion and a pixel circuit of a transistor layer and that penetrates the semiconductor layer. Thus, a DTI-formed penetration wiring portion may serve as a pixel isolation layer between adjacent unit pixels so that optical/electrical crosstalk may be prevented and the size of the unit pixel may be reduced.

The pixel array 2110 may include a plurality of unit pixels arranged in a two-dimensional (2D) matrix. Each of the unit pixels may include a photodetector. The photodetector may generate charge by absorbing light and provide electrical signals (e.g., defined output voltages) corresponding to the generated charges to the pixel signal processing unit 2140 via vertical signal lines. Each unit pixel included in the pixel array 2110 may provide an output voltage one-by-one in units of a row. Thus, unit pixels of one row of the pixel array 2110 may be simultaneously activated in response to selection signals output by the row driver 2120. A unit pixel of the selected row may provide an output voltage caused by absorbed light to an output line of a column corresponding to the row.

The controller 2130 may control the row driver 2120 so that the pixel array 2110 may absorb light so as to accumulate charges, or may store the accumulated charges temporarily and may output electrical signals caused by the stored charges to an outer portion of the pixel array 2110. Also, the controller 2130 may control the pixel signal processing unit 2140 so as to measure the output voltage provided by the pixel array 2110.

The pixel signal processing unit 2140 may include a correlation double sampler (CDS) 2142, an analog-digital converter (ADC) 2144, and a buffer 2146. The CDS 2142 may sample and hold the output voltage provided by the pixel array 2110. The CDS 2142 may sample a particular noise level and a level caused by the generated output voltage in a double manner and may output a level corresponding to a difference therebetween. Also, the CDS 2142 may receive ramp signals generated by a ramp generator 2148, may compare the ramp signals, and may output a result of the comparison.

The ADC 2144 may convert an analog signal corresponding to the level received from the CDS 2142 into a digital signal. The buffer 2146 may latch the digital signal, and the latched signal may be output to an outer portion of the image sensor 2100 and may be transmitted to an image processor (not shown).

Figure 11:
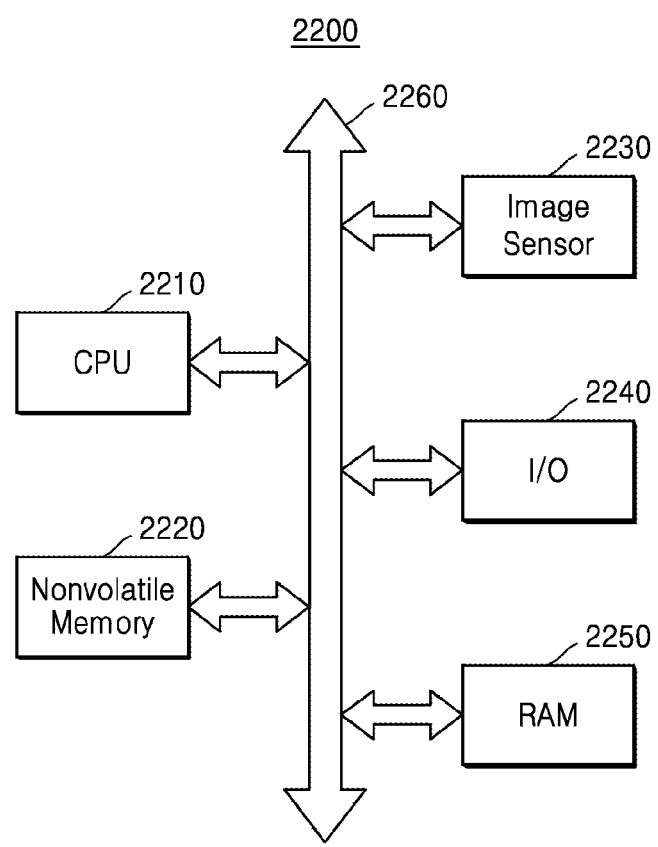
FIG. 11 is a block diagram of a system including an image sensor, according to an embodiment of the inventive concept.

FIG. 11 is a block diagram of a system 2200 that may include an image sensor according to an embodiment of the inventive concept. The system 2200 may be a computing system that requires image data, a camera system, a scanner, a car navigation device, a video phone, a security system, a movement detection system, etc.

As illustrated in FIG. 11, the system 2200 may include a central processing unit (CPU) (or a processor) 2210, nonvolatile memory 2220, an image sensor 2230, an input/output device 2240, and random access memory (RAM) 2250. The CPU 2210 may communicate with the nonvolatile memory 2220, the image sensor 2230, the input/output device 2240, and the RAM 2250 via a bus 2260. The image sensor 2240 may be implemented as independent semiconductor chips or may be combined with the CPU 2210 and may be implemented as one semiconductor chip. The image sensor 2230 included in the system 2200 of FIG. 11 may include unit pixels according to exemplary embodiments of the inventive concept described above. Each unit pixel may include an organic photoelectric conversion portion and a photodiode in a semiconductor layer or may be a unit pixel in which only organic photoelectric conversion portions are stacked. Thus, the size of the unit pixel for outputting an image may be reduced and a clearer image may be output.

Also, the unit pixel may further include a penetration wiring portion that electrically connects the organic photoelectric conversion portion and a pixel circuit in a transistor layer and that penetrates the semiconductor layer. Thus, when the penetration wiring portion is formed through a DTI process, the penetration wiring portion may serve as a pixel isolation layer between adjacent unit pixels so that optical/electrical crosstalk may be prevented and the size of the unit pixel may be reduced.

Figure 12:
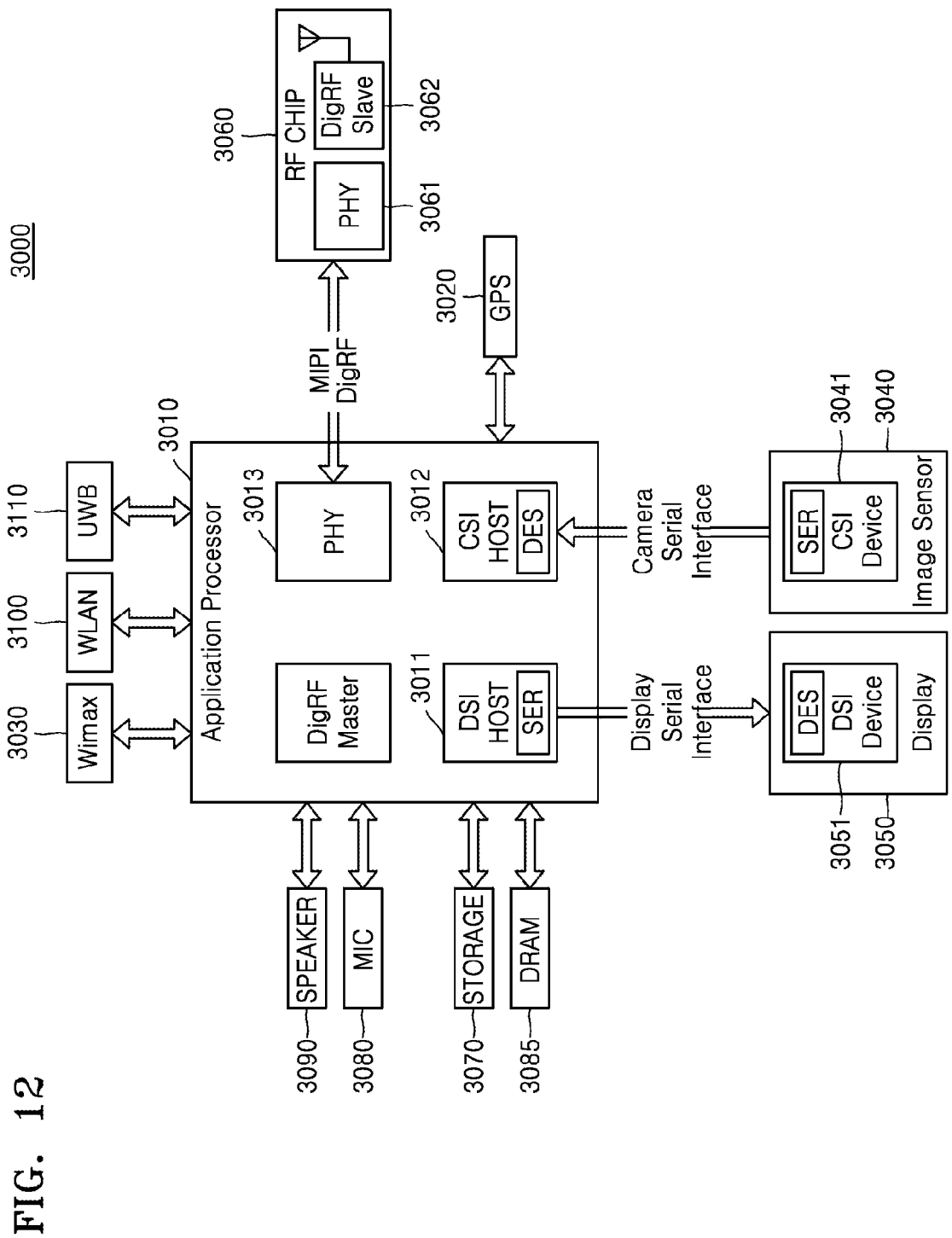
FIG. 12 illustrates an electronic system including an image sensor and an interface, according to an embodiment of the inventive concept.

FIG. 12 illustrates an electronic system 3000 including an image sensor and an interface, according to an embodiment of the inventive concept.

Referring to FIG. 12, the electronic system 3000 may be implemented as a data processing apparatus that may use or support a mipi interface, for example, a mobile phone, a personal digital assistant (PDA), a portable multimedia player (PMP) or a smartphone. The electronic system 3000 may include an application processor 3010, an image sensor 3040, and a display 3050.

A camera serial interface (CSI) host 3012 implemented in the application processor 3010 may perform serial communication with a CSI device 3041 of the image sensor 3040 via a CSI. In this case, for example, an optical deserializer may be implemented in the CSI host 3012, and an optical serializer may be implemented in the CSI device 3041.

A display serial interface (DSI) host 3011 implemented in the application processor 3010 may perform serial communication with a DSI device 3051 of the display 3050 via a DSI. In this case, for example, an optical serializer may be implemented in the DSI host 3011, and an optical deserializer may be implemented in the DSI device 3051.

The electronic system 3000 may further include a radio frequency (RF) chip 3060 that may communicate with the application processor 3010. A PHY interface 3013 of the electronic system 3000 and a PHY interface 3061 of the RF chip 3060 may exchange data based on MIPI DigRF.

The electronic system 3000 may further include a global positioning system (GPS) 3020, a storage 3070, a microphone 3080, dynamic RAM (DRAM) 3085, and a speaker 3090. The electronic system 3000 may perform communication using a worldwide interoperability for microwave access (Wimax) 3030, a wireless local area network (WLAN) 3100, and ultra-wideband (UWB) 3110.

While the inventive concept has been particularly shown and described with reference to exemplary embodiments thereof, it will be understood that various changes in form and details may be made therein without departing from the scope of the following claims.

What is claimed is:

1. An image sensor comprising a plurality of unit pixels, each of the unit pixels comprising:
   a semiconductor layer having an upper surface and an opposing lower surface;
   a first organic photoelectric conversion portion disposed on the upper surface of the semiconductor layer, that receives incident light, and converts a first color component of the incident light into a corresponding first electrical signal;
   a transistor layer disposed on the lower surface of the semiconductor layer and including a pixel circuit that receives the first electrical signal;
   a first penetration wiring that laterally penetrates a first side surface of the semiconductor layer between the upper and lower surfaces, and that electrically connects the first organic photoelectric conversion portion with the pixel circuit to communicate the first electrical signal;
   a second organic photoelectric conversion portion disposed on the first organic photoelectric conversion portion, that receives the incident light, and converts a second color component of the incident light into a corresponding second electrical signal; and
   a second penetration wiring that laterally penetrates a second side surface of the semiconductor layer between the upper and lower surfaces, and that electrically connects the second organic photoelectric conversion portion with the pixel circuit to communicate the second electrical signal.

2. The image sensor of claim 1, further comprising:
   a photodetector disposed on the lower surface of the semiconductor layer;
   a color filter layer disposed on the upper surface of the semiconductor layer that passes a third color component of the incident light different from the first color component and the second color component, such that the third color component is incident onto and is absorbed by the photodetector, and the photodetector accumulates electrical charge in proportion to the absorbed third color component and generates a corresponding third electrical signal communicated to the pixel circuit; and
   a lens layer disposed on the second organic photoelectric conversion portion that focuses the incident light through the second and first organic photoelectric conversion portions towards the photodetector.

3. The image sensor of claim 2, wherein the first organic photoelectric conversion portion comprises:
   a first lower electrode disposed on the color filter layer;
   a first color selection layer disposed on the first lower electrode; and
   a first upper electrode disposed on the first color selection layer.

4. The image sensor of claim 3, wherein the second organic photoelectric conversion portion comprises:
   a second lower electrode disposed on the first upper electrode;
   a second color selection layer disposed on the second lower electrode; and
   a second upper electrode disposed on the second color selection layer.

5. The image sensor of claim 1, wherein the first penetration wiring is disposed in a first region of the semiconductor layer extending from the upper surface to the lower surface that was removed using a deep trench isolation (DTI) technique, and the second penetration wiring is disposed in a second region of the semiconductor layer extending from the upper surface to the lower surface that was removed using a DTI technique.

6. The image sensor of claim 5, wherein each of the first and second penetration wiring comprises:
an outer portion formed of a dielectric material having a lower refractive index than material used to form the semiconductor layer; and
an inner portion formed of a conductive material that communicates the electrical signals from the organic photoelectric conversion portions to the pixel circuit.

7. The image sensor of claim 1, further comprising:
a third organic photoelectric conversion portion disposed on the second organic photoelectric conversion portion, that receives the incident light, and converts a third color component of the incident light into a corresponding third electrical signal; and
a third penetration wiring that laterally penetrates a third side surface of the semiconductor layer between the upper and lower surfaces and that electrically connects the third organic photoelectric conversion portion with the pixel circuit to communicate the third electrical signal.

8. The image sensor of claim 7, further comprising:
a lens layer disposed on the third organic photoelectric conversion portion that focuses the incident light through the third, second and first organic photoelectric conversion portions towards the semiconductor layer.

9. The image sensor of claim 7, wherein the first, second and third penetration wirings are respectively disposed in first, second and third regions of the semiconductor layer extending from the upper surface to the lower surface that were removed using a deep trench isolation (DTI) technique.

10. The image sensor of claim 9, wherein each of the first, second and third penetration wirings comprise:
an outer portion formed of a dielectric material having a lower refractive index than material used to form the semiconductor layer; and
an inner portion formed of a conductive material that communicates the electrical signals from the organic photoelectric conversion portions to the pixel circuit.

11. The image sensor of claim 1, wherein the pixel circuit comprises a signal charge reading unit.

12. An image sensor comprising a plurality of unit pixels, each of the unit pixels comprising:
a semiconductor layer having an upper surface and an opposing lower surface;
a first organic photoelectric conversion portion disposed on the upper surface of the semiconductor layer, that receives incident light, and converts a first color component of the incident light into a corresponding first electrical signal;
a transistor layer disposed on the lower surface of the semiconductor layer and including a pixel circuit that receives the first electrical signal;
a first penetration wiring that laterally penetrates a first side surface of the semiconductor layer between the upper and lower surfaces, and that electrically connects the first organic photoelectric conversion portion with the pixel circuit to communicate the first electrical signal;
a photodetector disposed on the lower surface of the semiconductor layer;
a color filter layer disposed on the upper surface of the semiconductor layer that passes a second color component of the incident light different from the first color component, such that the second color component is incident onto and is absorbed by the photodetector, and the photodetector accumulates electrical charge in proportion to the absorbed second color component and generates a corresponding second electrical signal communicated to the pixel circuit; and
a lens layer disposed on the first organic photoelectric conversion portion that focuses the incident light through the first organic photoelectric conversion portion towards the photodetector.

13. The image sensor of claim 12, wherein the first penetration wiring is disposed in a region of the semiconductor layer extending from the upper surface to the lower surface that was removed using a deep trench isolation (DTI) technique.

14. The image sensor of claim 13, wherein the first penetration wiring comprises:
an outer portion formed of a dielectric material having a lower refractive index than material used to form the semiconductor layer; and
an inner portion formed of a conductive material that communicates the first electrical signal from the first organic photoelectric conversion portion to the pixel circuit.

15. The image sensor of claim 12, wherein the first organic photoelectric conversion portion comprises:
a first lower electrode disposed on the color filter layer;
a first color selection layer disposed on the first lower electrode; and
a first upper electrode disposed on the first color selection layer.

16. An image sensor comprising an array of unit pixels, each of the unit pixels comprising:
a semiconductor layer having an upper surface and an opposing lower surface;
an organic photoelectric conversion portion disposed on the upper surface of the semiconductor layer, that receives incident light, and converts a color component of the incident light into a corresponding electrical signal;
a transistor layer disposed on the lower surface of the semiconductor layer and including a pixel circuit that receives the electrical signal; and
a penetration wiring that laterally penetrates an external side surface of the semiconductor layer between the upper and lower surfaces as formed by application of a deep-trench isolation technique, and that electrically connects the organic photoelectric conversion portion with the pixel circuit to communicate the electrical signal, and that is formed at a boundary region with an adjacent unit pixel,
wherein the penetration wiring blocks introduction of incident light coming from a direction of the adjacent unit pixel in the array of pixel units and blocks electrical charge passing from the adjacent unit pixel in the array of unit pixels, and
wherein the penetration wiring comprises:
an outer portion formed of a dielectric material having a lower refractive index than material used to form the semiconductor layer; and
an inner portion formed of a conductive material that communicates the electrical signal from the organic photoelectric conversion portion to the pixel circuit.

17. The image sensor of claim 16, wherein the penetration wiring is disposed in a region of the semiconductor layer extending from the upper surface to the lower surface that was removed using a deep trench isolation (DTI) technique.

* * * * *